United States Patent
Inoue et al.

(10) Patent No.: US 7,859,341 B2
(45) Date of Patent: *Dec. 28, 2010

(54) SEMICONDUCTOR DEVICE

(75) Inventors: Akira Inoue, Tokyo (JP); Seiko Goto, Tokyo (JP); Kou Kanaya, Tokyo (JP); Sinsuke Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/715,424

(22) Filed: Mar. 2, 2010

(65) Prior Publication Data

US 2010/0156541 A1 Jun. 24, 2010

Related U.S. Application Data

(62) Division of application No. 11/874,966, filed on Oct. 19, 2007, now Pat. No. 7,701,296.

(30) Foreign Application Priority Data

May 23, 2007 (JP) .............................. 2007-137127

(51) Int. Cl.
 H03F 3/04 (2006.01)
(52) U.S. Cl. ...................................................... 330/298

(58) Field of Classification Search ................. 330/296, 330/298, 207 P; 329/309
 See application file for complete search history.

(56) References Cited

U.S. PATENT DOCUMENTS

| 5,268,649 | A  | * | 12/1993 | Jones ......................... 330/296 |
| 7,388,429 | B2 |   | 6/2008  | Ui |
| 7,701,296 | B2 | * | 4/2010  | Inoue et al. ................. 330/298 |
| 2007/0052481 | A1 |   | 3/2007 | Newman et al. |

FOREIGN PATENT DOCUMENTS

| DE | 1 764 713 | 10/1971 |
| JP | 4-31782 A | 2/1992 |

* cited by examiner

*Primary Examiner*—Robert Pascal
*Assistant Examiner*—Khiem D Nguyen
(74) *Attorney, Agent, or Firm*—Leydig, Voit & Mayer, Ltd.

(57) ABSTRACT

A current limiting circuit is connected to the gate (input terminal) of an amplifying transistor. The current limiting circuit includes a protecting transistor, a first protecting resistor connecting the drain to the gate of the protecting transistor, and a second protecting resistor connecting the source to the gate of the protecting transistor. The current limiting circuit limits current, so that electric power larger than the maximum electric power allowable for the amplifying transistor does not pass.

4 Claims, 12 Drawing Sheets

SEMICONDUCTOR DEVICE

BACKGROUND OF THE INVENTION

1. Field of the Invention

The present invention relates to a small and light semiconductor device that can be manufactured at low costs, and is highly resistant to destruction even if excessively large electric power is supplied.

2. Background Art

Figure 22:
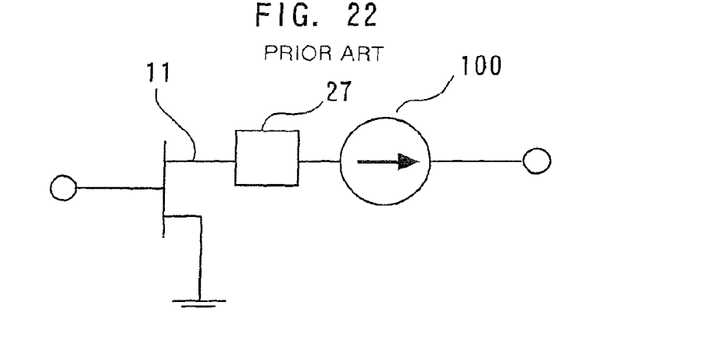
FIG. 22 is a circuit diagram showing a conventional single-stage amplifier.

FIG. 22 is a circuit diagram showing a conventional single-stage amplifier. An amplifying transistor 11 is a field effect transistor (FET) used for high-frequency waves of 0.1 GHz to 110 GHz, for example, the 2.1 GHz band. Input signals from the exterior are inputted in the gate (input terminal) of the amplifying transistor 11. The output signals of the amplifying transistor 11 are outputted to an antenna (not shown) from the drain (output terminal) via a matching circuit 27. Generally in communications systems and radars, a plurality of amplifiers are connected to the antenna to output electric waves.

However, if the antenna is positioned in the vicinity of a metal surface, outputted electromagnetic waves may be reflected and fed back to the amplifying transistor 11. In such a case, if large electric power is fed back, the amplifying transistor 11 may be destructed. To prevent this, an isolator 100 is connected to the output side of the amplifying transistor 11 (for example, refer to Japanese Patent Laid-Open No. 4-31782).

Figure 23:
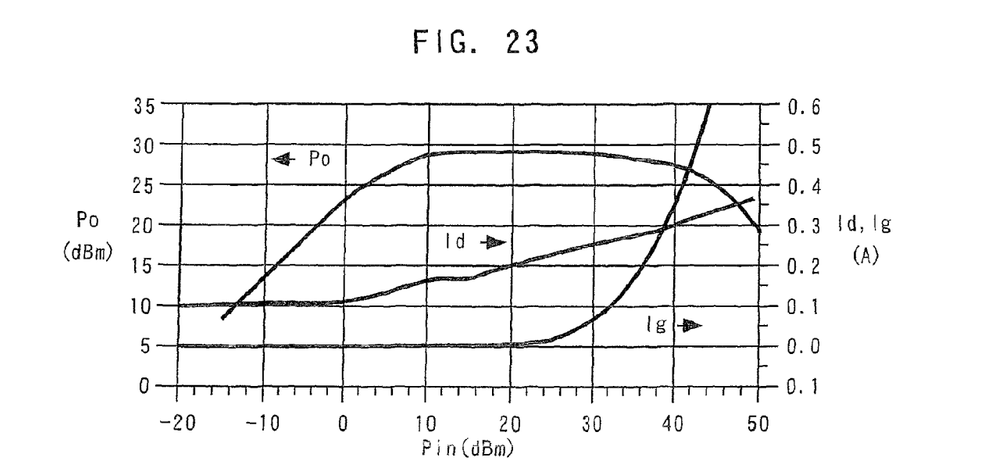
FIG. 23 is a graph showing the results of calculations for the input-output characteristics of a conventional amplifier at 2.1 GHz.

FIG. 23 is a graph showing the results of calculations for the input-output characteristics of a conventional amplifier at 2.1 GHz. In FIG. 23, $P_{in}$ denotes input power, $P_o$ denotes output power, $I_d$ denotes drain current, and $I_g$ denotes gate current. The gate width of the amplifying transistor 11 is 1 mm, and the maximum current $I_{max}$ is 400 mA. It is known from these results that an average current of 50 mA/mm flows in the gate when $P_{in}$ exceeds 25 dBm. Since the amplifying transistor 11 is destructed if such a large current flows, input of $P_{in}$ not less than 25 dBm must be prevented.

Figure 24:
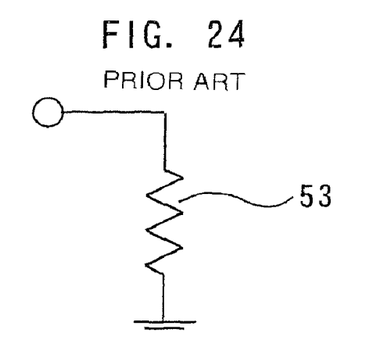
FIG. 24 is a circuit diagram showing a conventional terminating resistor.

FIG. 24 is a circuit diagram showing a conventional terminating resistor. An end of the terminating resistor 53 is grounded in terms of high-frequency waves. In microwave-band equipment, the resistance value of the terminating resistor 53 is 50Ω, which is common as impedance.

Figure 25:
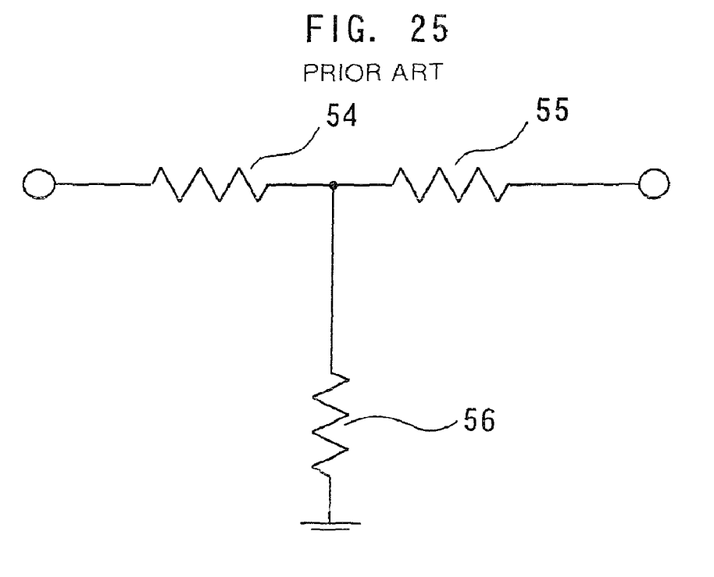
FIG. 25 is a circuit diagram showing a conventional T-shaped attenuator.

FIG. 25 is a circuit diagram showing a conventional T-shaped attenuator. First and second resistors 54 and 55 are connected in series. An end of a third resistor 56 is connected to the connecting point of the first resistor 54 and the second resistor 55, and the other end is grounded in terms of high-frequency waves. By selecting the resistance values of the first to third resistors 54 to 56, a desired attenuation can be obtained.

SUMMARY OF THE INVENTION

In the circuit shown in FIG. 22, since the isolator 100 is a magnetic circuit, there is a problem wherein the size and weight are increased, and the magnet is enlarged to treat large electric power, resulting in high costs. There is also a problem wherein an excessively high high-frequency voltage is supplied to the gate by unexpected electromagnetic conduction or the failure of the equipment, and the amplifying transistor 11 is destructed.

Also in the circuits shown in FIGS. 24 and 25 have a problem wherein if high-frequency signals exceeding the allowable power are supplied, the terminating resistor 53 or first to third resistors 54 to 56 are burned and destructed. In order to elevate the allowable power, the sizes of the terminating resistor 53 or first to third resistors 54 to 56 must be enlarged to improve heat dissipation, and there is a problem of high costs due to the elevation of the sizes and weights of the terminating resistor 53 or first to third resistors 54 to 56.

To solve the above-described problems, it is an object of the present invention to provide a small and light semiconductor device that can be manufactured at low costs, and is highly resistant to destruction even if excessively large electric power is supplied.

According to one aspect of the present invention, a semiconductor device comprising: an amplifying transistor and a current limiting circuit connected to the input terminal of said amplifying transistor, wherein said current limiting circuit limits current so that an electric power larger than the maximum electric power allowable to said amplifying transistor does not pass.

According to the present invention, a small and light semiconductor device that is highly resistant to destruction even if an excessive electric power is supplied can be obtained at low costs.

Other and further objects, features and advantages of the invention will appear more fully from the following description.

DETAILED DESCRIPTION OF THE PREFERRED EMBODIMENTS

First Embodiment

Figure 1:
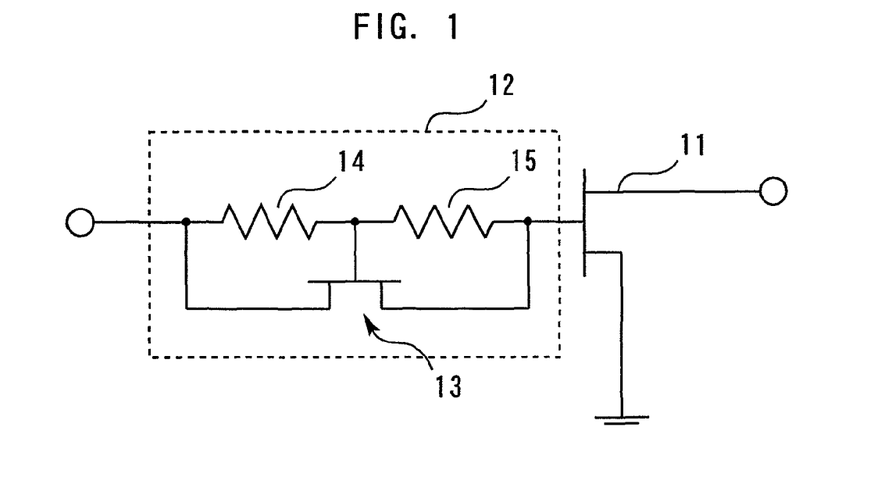
FIG. 1 is a circuit diagram showing a semiconductor device according to the first embodiment of the present invention.

FIG. 1 is a circuit diagram showing a semiconductor device according to the first embodiment of the present invention. An amplifying transistor 11 is a field effect transistor used for high-frequency waves not less than 0.1 GHz and not more than 110 GHz, for example, in the 2.1 GHz band. A current limiting circuit 12 is connected to the gate (input terminal) of the amplifying transistor 11. The source of the amplifying transistor 11 is grounded in terms of high-frequency waves, and output signals are outputted from the drain (output terminal) of the amplifying transistor 11.

The current limiting circuit 12 has a protecting transistor 13, a first protecting resistor 14 that connects the source and the gate of the protecting transistor 13, and a second protecting resistor 15 that connects the drain and the gate of the protecting transistor 13.

Figure 2:
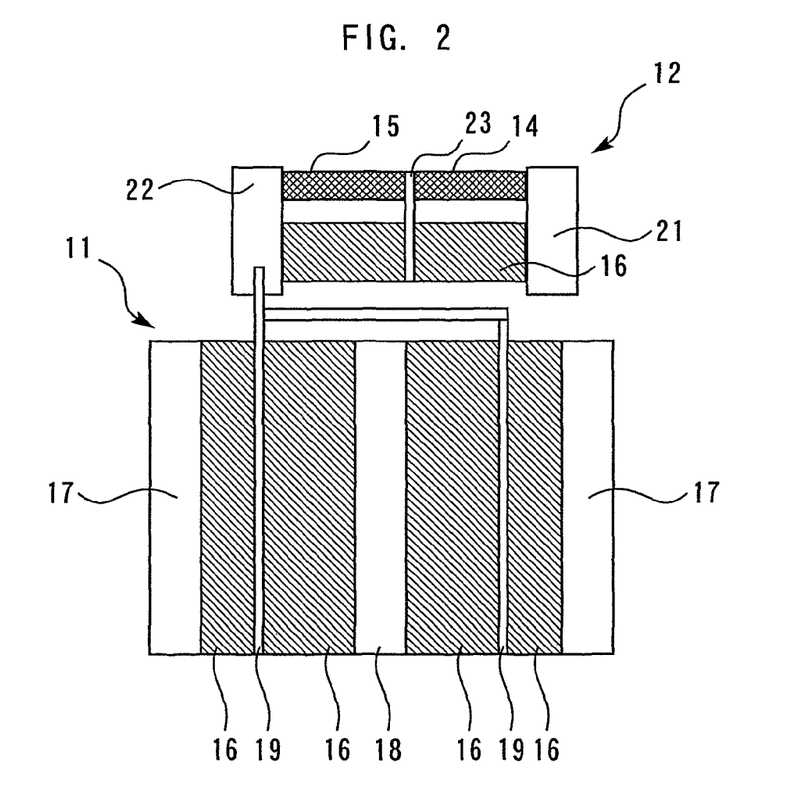
FIG. 2 is a top view showing the semiconductor device according to the first embodiment of the present invention.

FIG. 2 is a top view showing the semiconductor device according to the first embodiment of the present invention. Active regions 16 are formed by implanting an impurity into a semiconductor layer. The interiors of the active regions 16 function as transistors. Source electrodes 17 and a drain electrode 18 are ohmically connected to the active regions 16. Gate electrodes 19 are provided between the source electrodes 17 and the drain electrode 18. These source electrodes 17, drain electrode 18, and gate electrodes 19 constitute the amplifying transistor 11.

A source electrode 21 and a drain electrode 22 are ohmically connected to the active regions 16. A gate electrode 23 is provided between the source electrode 21 and the drain electrode 22. These source electrode 21, drain electrode 22, and gate electrode 23 constitute the protecting transistor 13. The source electrode 21 and the gate electrode 23 of the protecting transistor 13 are connected by a first protecting resistor 14 composed of a metal film, and the drain electrode 22 and the gate electrode 23 are connected by a second protecting resistor 15 composed of a metal film. The drain electrode 22 of the protecting transistor 13 is connected to the gate electrodes 19 of the amplifying transistor 11.

Figure 3:
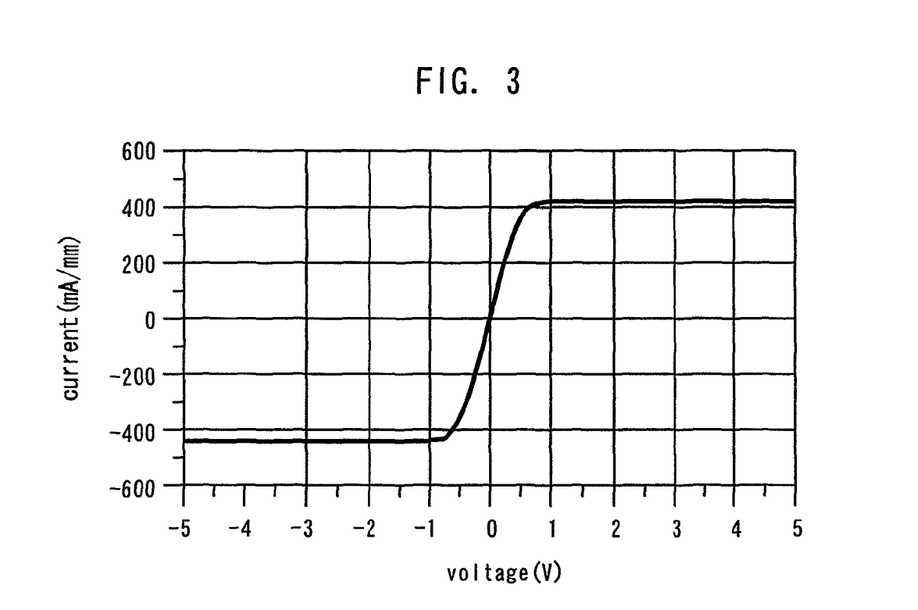
FIG. 3 is a graph showing the results of calculating the voltage-current characteristics of a current limiting circuit according to the first embodiment of the present invention when the resistance value of the first and second resistors is 50 kΩ.
Figure 4:
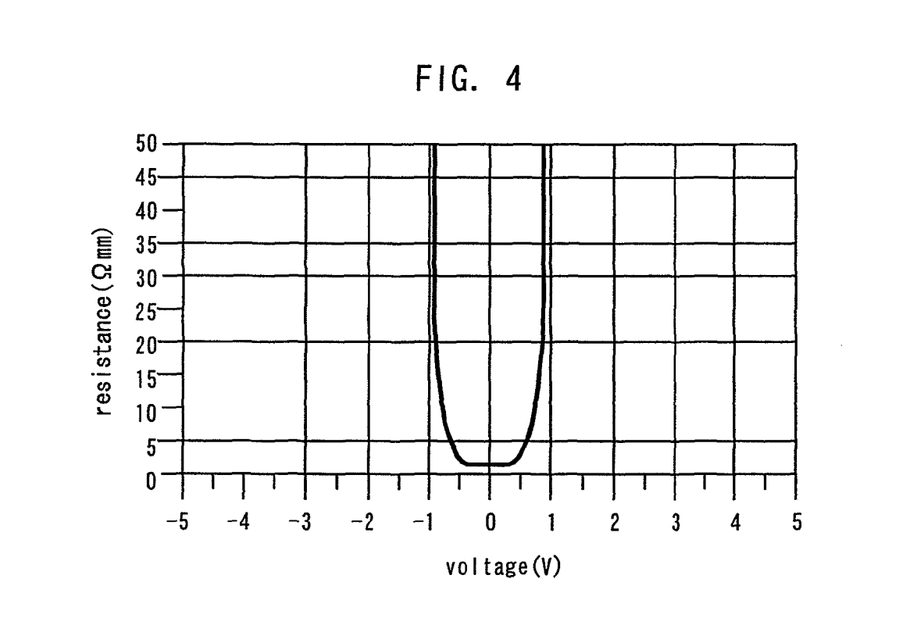
FIG. 4 is a graph showing the results of calculating the voltage-resistance characteristics of the same current limiting circuit.

FIG. 3 is a graph showing the results of calculating the voltage-current characteristics of a current limiting circuit according to the first embodiment of the present invention when the resistance value of the first and second resistors is 50 kΩ; and FIG. 4 is a graph showing the results of calculating the voltage-resistance characteristics of the same current limiting circuit. If the voltage across the ends of the current limiting circuit 12 is as low as not exceeding 0.4 V, the current limiting circuit 12 exhibits linear voltage-current characteristics, similar to the voltage-current characteristics of a resistor. Here, the resistance value per unit gate width is about 1.3Ω. Specifically, the current flowing through the current limiting circuit 12 is 300 mA/mm or less, the current limiting circuit 12 functions as a resistor of 1.3Ω. On the other hand, when the current exceeds 300 mA/mm, the resistance value of the current limiting circuit 12 is sharply elevated, and current exceeding 420 mA/mm does not flow.

Even when high-frequency signals with an excessive electric power are thus inputted as input signals, the current limiting circuit 12 limits current so that electric power larger than the maximum power allowable to the amplifying transistor 11 does not pass. Therefore, a semiconductor device that is highly resistant to destruction even if an excessive electric power is supplied can be obtained. The current limiting circuit 12 can also be realized to be small and light at low costs.

Figure 5:
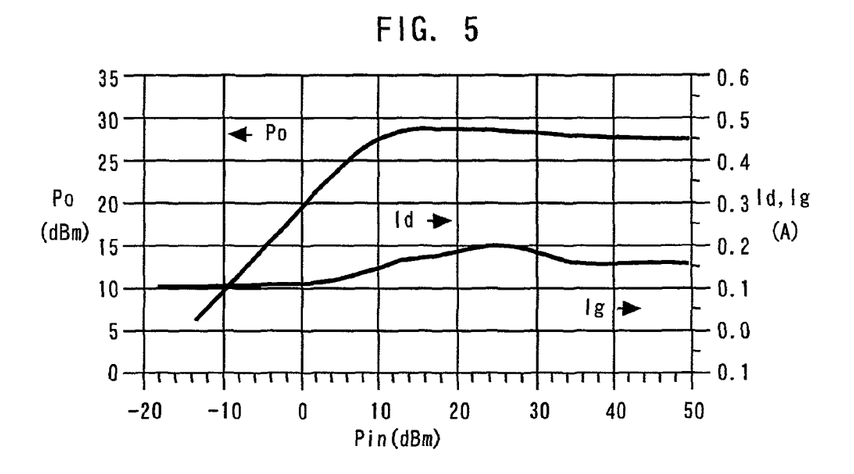
FIG. 5 is a graph showing the results of calculating input-output characteristics when a current limiting circuit of the maximum current of 86 mA is connected to an amplifying transistor.
Figure 6:
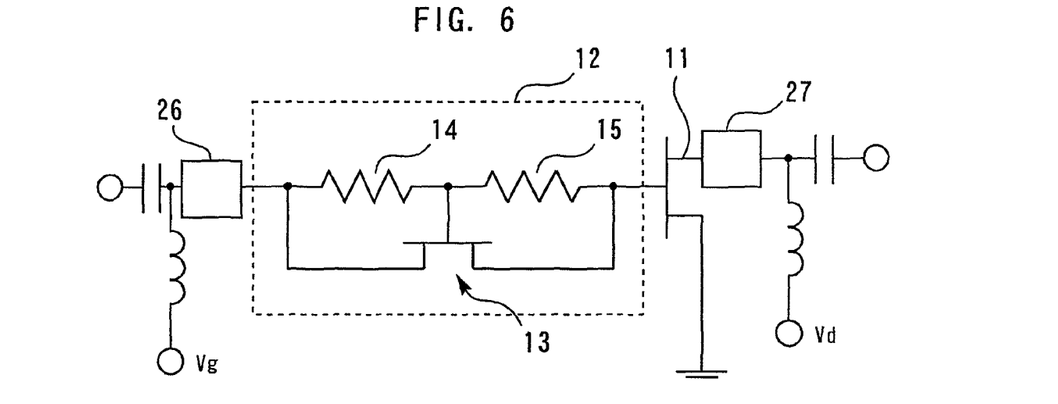
FIG. 6 is a circuit diagram showing a circuit used for calculation.

FIG. 5 is a graph showing the results of calculating input-output characteristics when a current limiting circuit of the maximum current of 86 mA is connected to an amplifying transistor. FIG. 6 is a circuit diagram showing a circuit used for calculation. The circuit has a configuration wherein matching circuits 26 and 27 are connected to the input terminal and the output terminal, respectively, and electric power is supplied from the exterior to the amplifying transistor 11. The gate width of the protecting transistor 13 is 0.2 mm. Since the maximum current of the amplifying transistor 11 is 400 mA, the current limiting circuit 12 limits the current to ⅕ the maximum current of the amplifying transistor 11.

From the results of calculation, no gate current flows even when the input power up to 50 dBm is supplied. Although the amplifying transistor 11 was conventionally destructed when the input power was elevated to 25 dBm, after providing a current limiting circuit 12 the amplifying transistor 11 is not destructed even when the input power is 50 dBm. Therefore, when a current limiting circuit 12 that limits current to ⅕ or lower the maximum current of the amplifying transistor 11 is used, a semiconductor device that is highly resistant to destruction even if an excessive electric power is supplied can be obtained.

When impedance Zo is 50Ω and the input power is 50 dBm, the voltage supplied to the current limiting circuit 12 is about ±35 V. Therefore, to allow the semiconductor device according to the present invention to function, both the breakdown voltage between the gate and the drain and the breakdown voltage between the gate and the source of the protecting transistor 13 must be at least 35 V. This is a value that can be realized in a GaAs transistor. However, if a GaN transistor is used as the protecting transistor 13, higher breakdown voltage, such as 60V or higher, can be realized.

Figure 7:
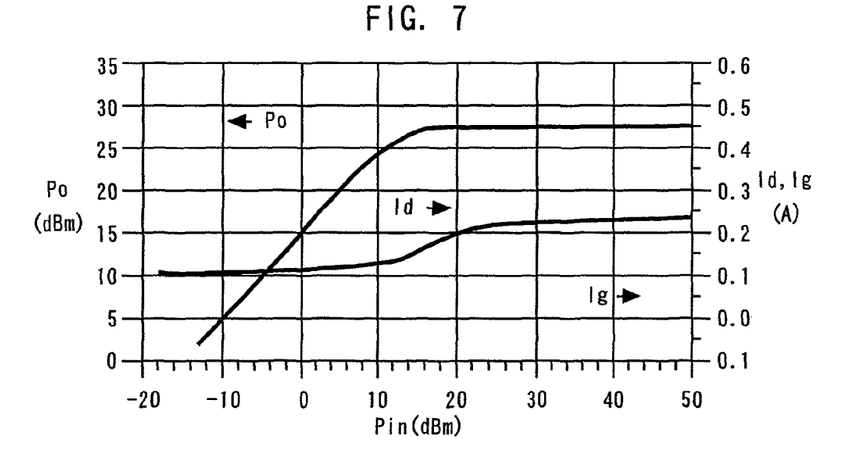
FIG. 7 is a graph showing the results of calculating input-output characteristics when a current limiting circuit of the maximum current of 26 mA is connected to an amplifying transistor. The gate width of the protecting transistor 13 is 0.06 mm.

FIG. 7 is a graph showing the results of calculating input-output characteristics when a current limiting circuit of the maximum current of 26 mA is connected to an amplifying transistor. The gate width of the protecting transistor 13 is 0.06 mm. Since the maximum current of the amplifying transistor 11 is 400 mA, the current limiting circuit 12 limits the current to 1/15 the maximum current of the amplifying transistor 11. Since the current limiting circuit 12 limits current to be lower than the current in the example shown in FIG. 5, it functions as a limiter amplifier that limits output power to be constant against input power within a wide range between 16 and 50 dBm.

Figure 8:
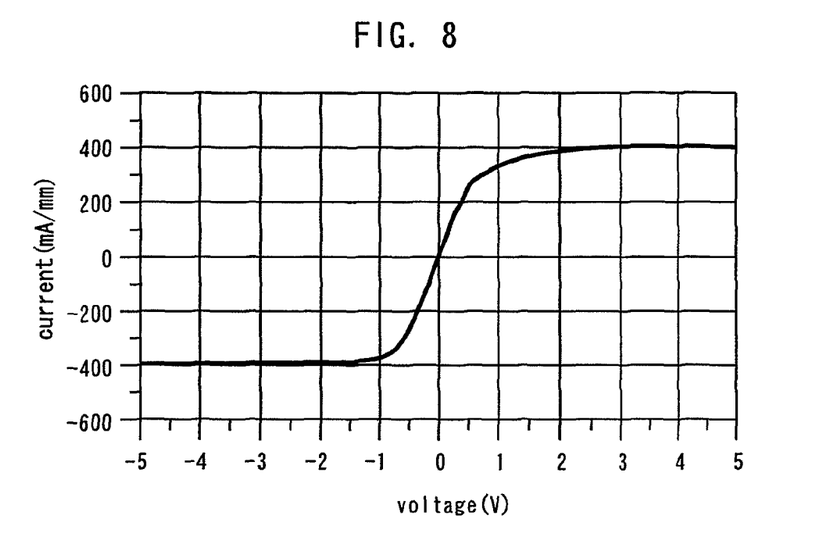
FIG. 8 is a graph showing the results of calculating the voltage-current characteristics of a current limiting circuit according to the first embodiment of the present invention when the resistance value of the first resistors is 50 kΩ and the resistance value of second resistors is 150 kΩ.
Figure 9:
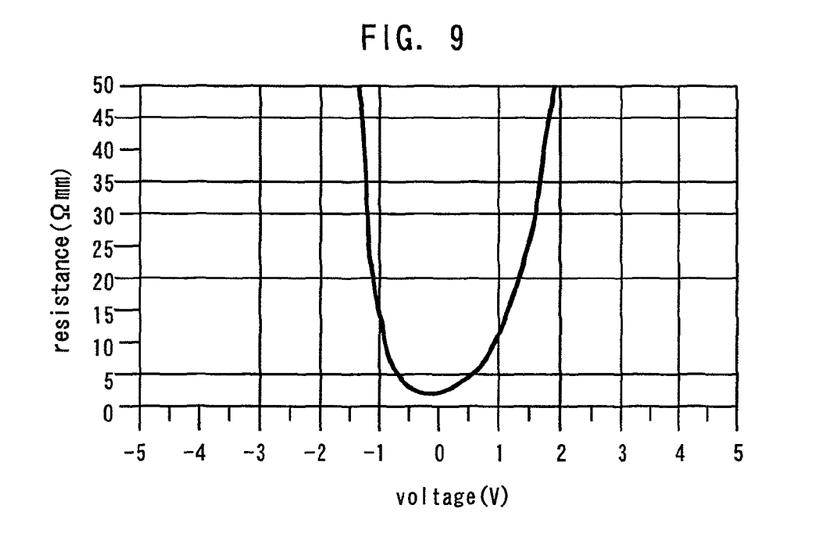
FIG. 9 is a graph showing the results of calculating the voltage-resistance characteristics of the same current limiting circuit.

FIG. 8 is a graph showing the results of calculating the voltage-current characteristics of a current limiting circuit according to the first embodiment of the present invention when the resistance value of the first resistors is 50 kΩ and the resistance value of second resistors is 150 kΩ; and FIG. 9 is a graph showing the results of calculating the voltage-resistance characteristics of the same current limiting circuit. Even when the resistance value of the first protecting resistor 14 is different from the resistance value of the second protecting resistor 15, current can be similarly limited. However, the current values become asymmetric depending to whether the voltage across the current limiting circuit 12 is positive or negative. Therefore, there is disadvantage wherein direct-current components are strayed by the asymmetry of wave forms when high-frequency power is supplied. Therefore, to obtain a constant output power especially as a limiter amplifier, it is preferable that the resistance values of the first and second resistors 14 and 15 are equalized, and the current flowing into the current limiting circuit 12 is symmetry to the polarity of the voltage supplied to the current limiting circuit 12.

If the current limiting circuit 12 provided in the close vicinity of the gate of the amplifying transistor 11, unnecessary LC parasitic components do not enter between the current limiting circuit 12 and the gate of the amplifying transistor 11, the current of the current limiting circuit 12 becomes the gate current of the amplifying transistor 11 as it is, and high-frequency current can be more limited.

In the first embodiment, although a field effect transistor is used as the amplifying transistor, other types of transistors, such as a bipolar transistor, may also be used. Also in the first embodiment, although a source-grounded transistor is used as the amplifying transistor 11, the present invention is not limited thereto, but a gate-grounded transistor may also be used. In this case, the current limiting circuit 12 is connected to the source of the amplifying transistor 11. If a similar current limiting circuit is connected to the input terminal of other high-frequency circuit, such as a phase shifter and a switch, the other high-frequency circuit can be protected from excessive electric power.

Second Embodiment

Figure 10:
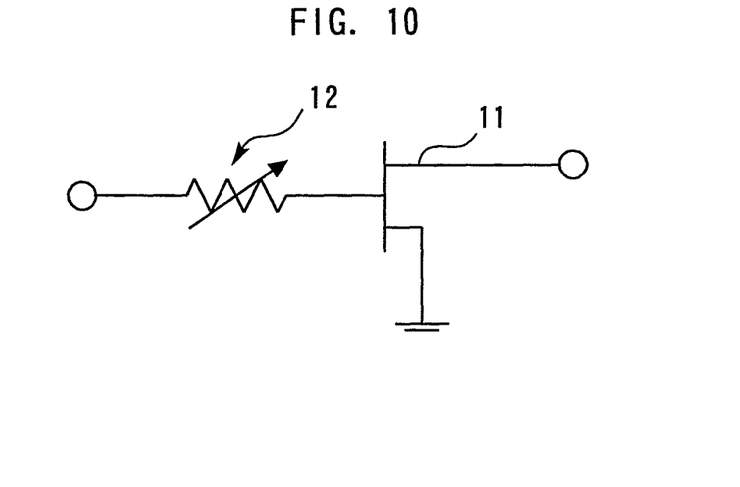
FIG. 10 is a circuit diagram showing a semiconductor device according to the second embodiment of the present invention.
Figure 11:
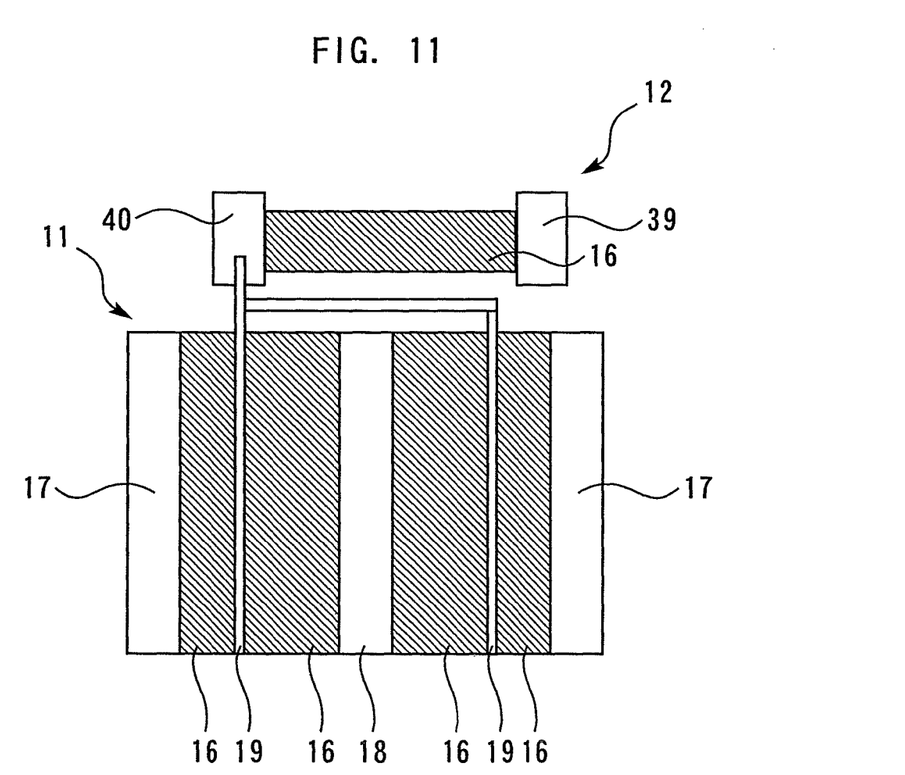
FIG. 11 is a top view showing the semiconductor device according to the second embodiment of the present invention.

FIG. 10 is a circuit diagram showing a semiconductor device according to the second embodiment of the present invention; and FIG. 11 is a top view showing the semiconductor device according to the second embodiment of the present invention. The current limiting circuit 12 has a transmission line model (TLM) structure equivalent to the epitaxial structure of a double hetero PHEMT (pseudomorphic high electron mobility transistor) without a gate. Other configurations are same as the configurations of the first embodiment.

Figure 12:
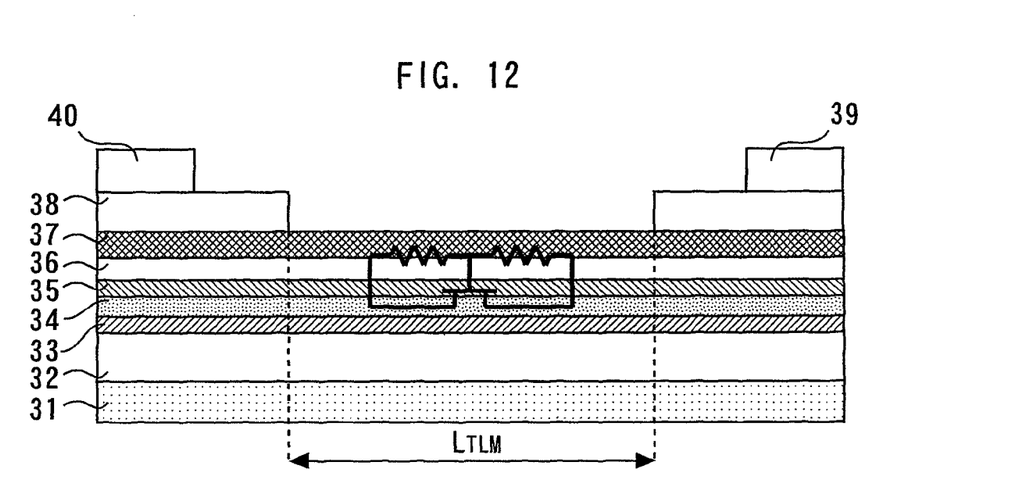
FIG. 12 is a sectional view showing a current limiting circuit according to the second embodiment of the present invention.

FIG. 12 is a sectional view showing a current limiting circuit according to the second embodiment of the present invention. A buffer layer 32, an n-AlGaAs layer 33, an i-InGaAs layer 34, an n-AlGaAs layer 35, an i-AlGaAs layer 36, an i-GaAs layer 37, and an n-GaAs layer 38 are sequentially laminated on an n-GaAs substrate 31. To the active regions formed in the semiconductor layers, first and second electrodes 39 and 40 are ohmically connected. Specifically, the current limiting circuit has an epitaxial structure that becomes a PHEMT when a gate electrode is added.

Figure 13:
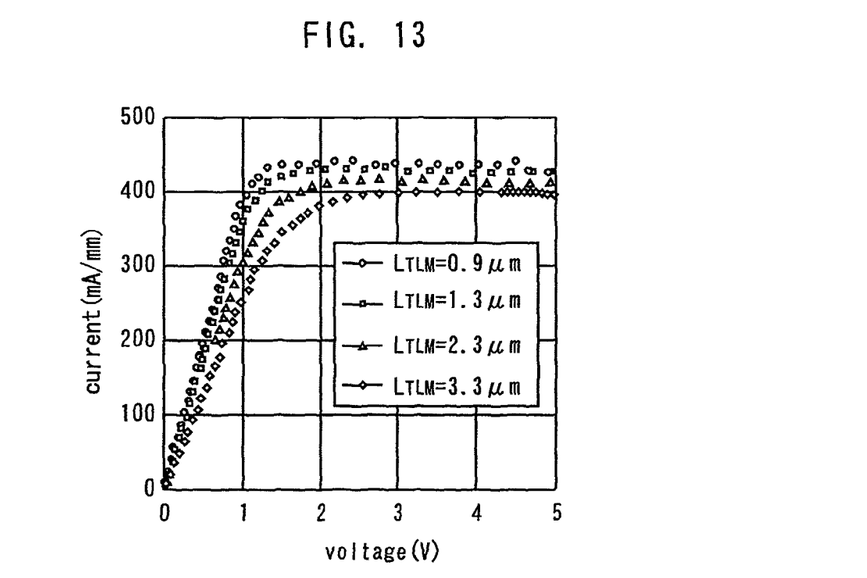
FIG. 13 is a graph showing the voltage-current characteristics of a current limiting circuit according to the second embodiment of the present invention.

FIG. 13 is a graph showing the voltage-current characteristics of a current limiting circuit according to the second embodiment of the present invention. As shown in the graph, the current limiting circuit 12 according to the second embodiment has current limiting characteristics similar to the current limiting characteristics of the first embodiment. Therefore, a semiconductor device that is highly resistant to destruction even if an excessive electric power is supplied can be obtained. The second embodiment has advantages wherein the structure is simpler and the chip area is smaller than those in the first embodiment.

It is known that although the maximum current changes little when the length $L_{TLM}$ is increased, the linear resistance value when the voltage supplied to the current limiting circuit 12 is low is elevated. When input power is small, since the lower the resistance, the lower the passage loss, and lower linear resistance value is desirable, a shorter $L_{TLM}$ is preferable. On the other hand, since higher breakdown voltage of the current limiting circuit 12 is desirable for elevating the maximum allowable power, a longer $L_{TLM}$ is preferable. The optimal length $L_{TLM}$ is determined by the tradeoff of these factors.

Figure 14:
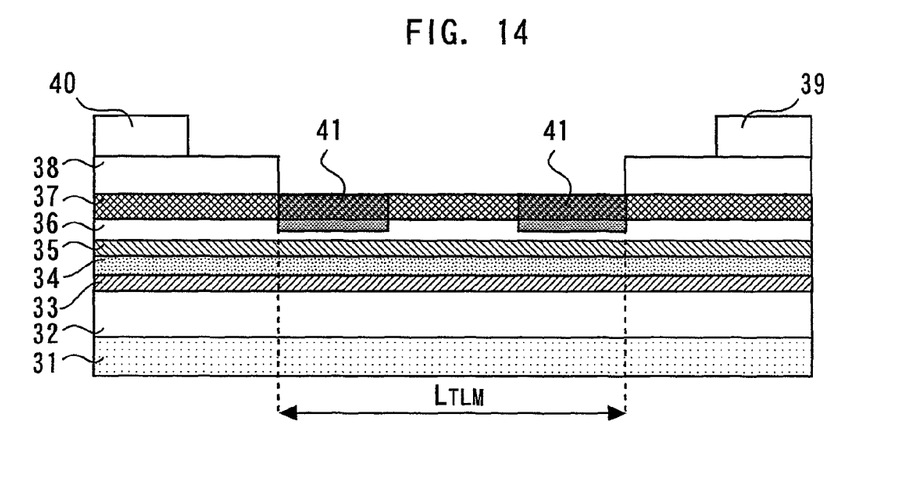
FIG. 14 is a sectional view showing a current limiting circuit according to the second embodiment of the present invention.
Figure 15:
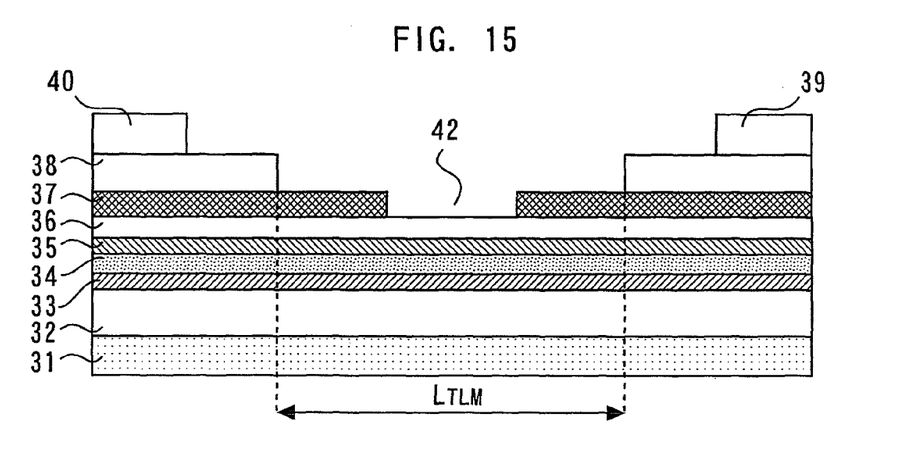
FIG. 15 is a sectional view showing a current limiting circuit according to the second embodiment of the present invention.

As shown in FIG. 14, by forming an n' layer 41 (high concentration region) in the active region by the implantation of an impurity between the first electrode 39 and the second electrode 40, the electric field can be reduced, and breakdown voltage can be elevated. Furthermore, as shown in FIG. 15, by forming a recess 42 in the active region between the first electrode 39 and the second electrode 40, the linear resistance value can be lowered while elevating breakdown voltage. Also by using a GaN layer as the semiconductor layer, the linear resistance value can be lowered and breakdown voltage can be elevated without enlarging the length $L_{TLM}$.

Although an epitaxial structure of a double hetero HEMT is used in the second embodiment, other epitaxial structures, such as HFET (hetero-structure field effect transistor) and MESFET (metal semiconductor field effect transistor) can also be used.

Third Embodiment

Figure 16:
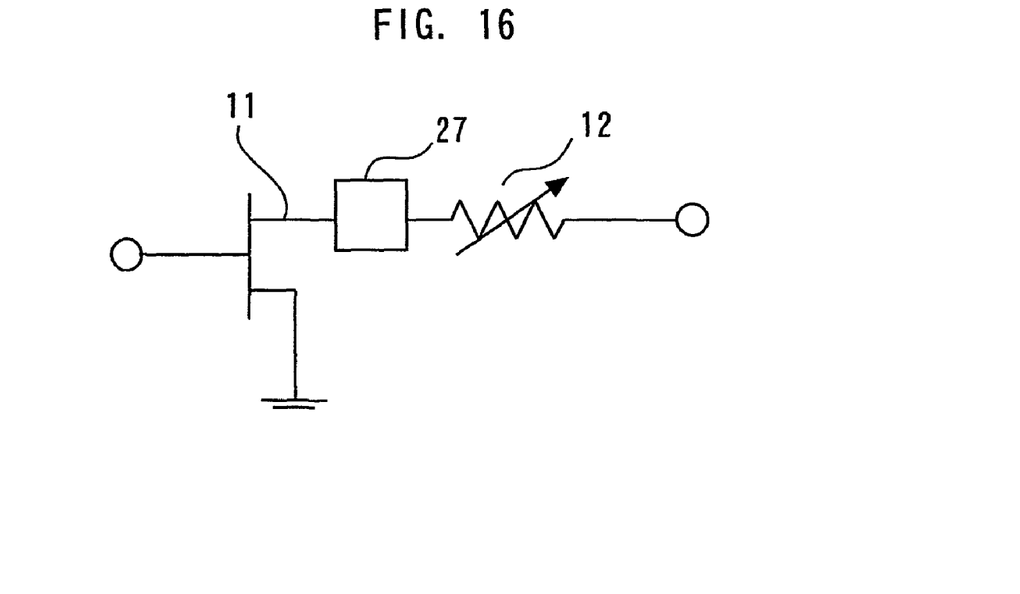
FIG. 16 is a circuit diagram showing a semiconductor device according to the third embodiment of the present invention.

FIG. 16 is a circuit diagram showing a semiconductor device according to the third embodiment of the present invention. A current limiting circuit 12 is connected to the drain (output terminal) of an amplifying transistor 11 via a matching circuit 27. The current limiting circuit 12 limits current so as not to pass an electric power larger than the maximum power allowed to the amplifying transistor 11. The configuration of the current limiting circuit 12 is the same as the current limiting circuit 12 according to the embodiments 1 and 2.

Thereby, since the current limiting circuit 12 limits current even if excessive electric power returns from the output side, no excessive electric power is supplied to the drain of the amplifying transistor 11. Therefore, a semiconductor device that is highly resistant to destruction even if an excessive electric power is supplied can be obtained. In addition, since an isolator, which has been conventionally required can be omitted, the size and weight of the semiconductor device can be reduced, and costs can be lowered.

In the third embodiment, although the current limiting circuit 12 is connected to the outside of the matching circuit 27, the current limiting circuit 12 can be connected to the middle of the matching circuit 27.

Fourth Embodiment

Figure 17:
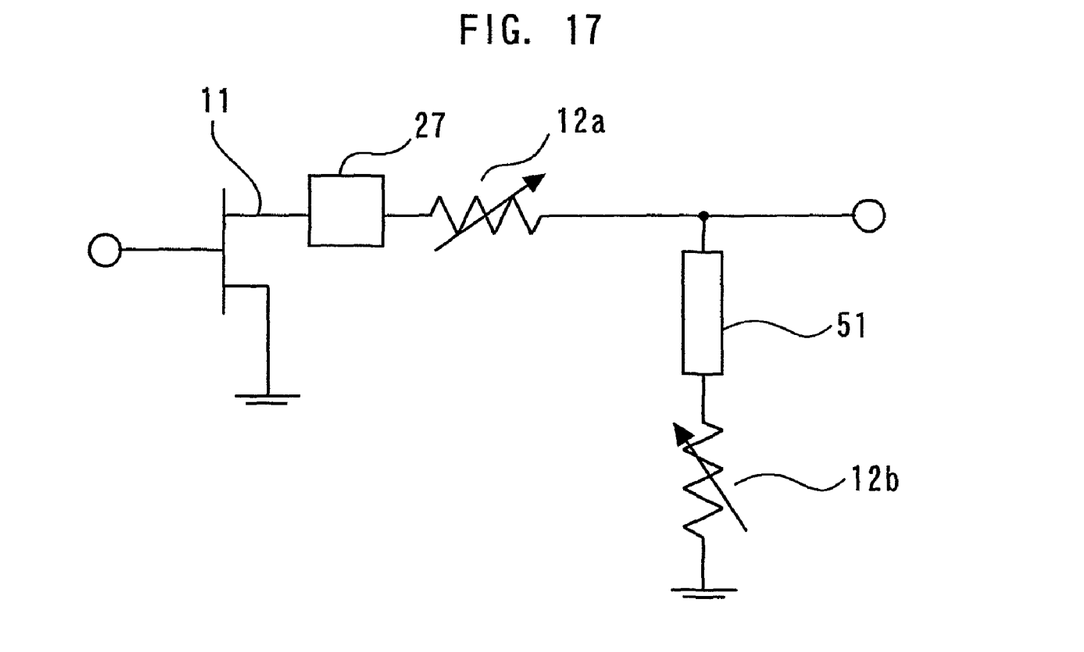
FIG. 17 is a circuit diagram showing a semiconductor device according to the fourth embodiment of the present invention.

FIG. 17 is a circuit diagram showing a semiconductor device according to the fourth embodiment of the present invention. An end of a ¼ wavelength line 51 is connected to the drain (output terminal) of an amplifying transistor 11 via a matching circuit 27 and a current limiting circuit 12a. An end of a current limiting circuit 12b is connected to the other end of the ¼ wavelength line 51, and the other end of the current limiting circuit 12b is grounded in terms of high-frequency waves. The configuration of the current limiting circuits 12a and 12b is the same as the current limiting circuit 12 according to the embodiments 1 and 2.

In the third embodiment, although no return power from the output side passes when the output end is short-circuited or has intermediate impedance, there is possibility that only voltage is supplied and no current is supplied to destruct the amplifying transistor 11, when the output impedance is open and the output of the amplifying transistor 11 is turned off. Whereas, in the fourth embodiment, even when only voltage is supplied, the current limiting circuit 12b connected to the ¼ wavelength line 51 limits the current. Therefore, output is short-circuited by the ¼ wavelength line 51, and the supply of excessive voltage to the amplifying transistor 11 is prevented.

Fifth Embodiment

Figure 18:
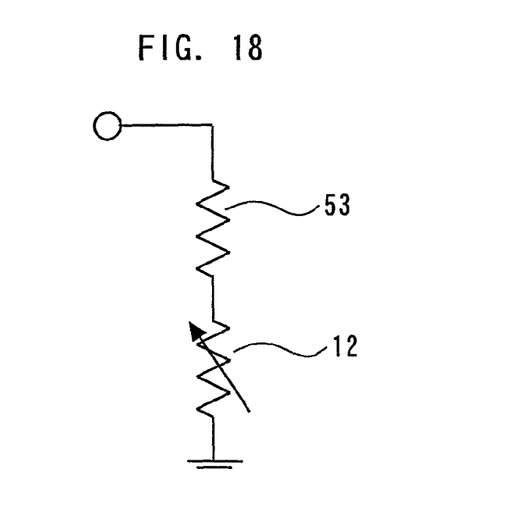
FIG. 18 is a circuit diagram showing a semiconductor device according to the fifth embodiment of the present invention.

FIG. 18 is a circuit diagram showing a semiconductor device according to the fifth embodiment of the present invention. An end of a current limiting circuit 12 is connected to a terminating resistor 53, and the other end of the current limiting circuit 12 is grounded in terms of high-frequency waves. The configuration of the current limiting circuit 12 is the same as the current limiting circuit 12 according to the embodiments 1and 2. The sum of the linear resistance value of the current limiting circuit 12 and the resistance value R of the terminating resistor 53 is set to agree with the impedance $Z_o$.

When the maximum power allowed to the terminating resistor 53 is $P_{max}$ (W), the current $I_{TLM}$ flowing in the current limiting circuit 12 is given by the following Formula 1:

$$I_{TLM} < \frac{\pi}{4}\sqrt{\frac{2P_{MAX}}{R}}$$ [Formula 1]

where π/4 is a factor wherein the fundamental wave component of a square wave is corrected.

If the current limiting circuit 12 is designed so as to satisfy the above-described conditions, the current limiting circuit 12 can limit current so that no electric power larger than the allowable maximum power $P_{max}$, passes through the terminating resistor 53. For example, when the current of the current limiting circuit 12 is 0.157 A for the terminating resistor 53 having a resistance of 50Ω and an allowable power of 1 W, the maximum power supplied to the terminating resistor 53 becomes 1 W. At this time, 100-W high-frequency power having impedance Zo of 50Ω is supplied, the voltage of the current limiting circuit 12 is about 50 V. Consequently, if the breakdown voltage of the current limiting circuit 12 is not lower than 50 V, the terminating resistor 53 is not burned. Therefore, a semiconductor device that is highly resistant to destruction even if an excessive electric power is supplied can be obtained. In the fifth embodiment, although the impedance of the terminating resistor 53 is 50Ω, the present invention is not limited thereto, but the terminating resistor 53 may have any impedance.

Sixth Embodiment

Figure 19:
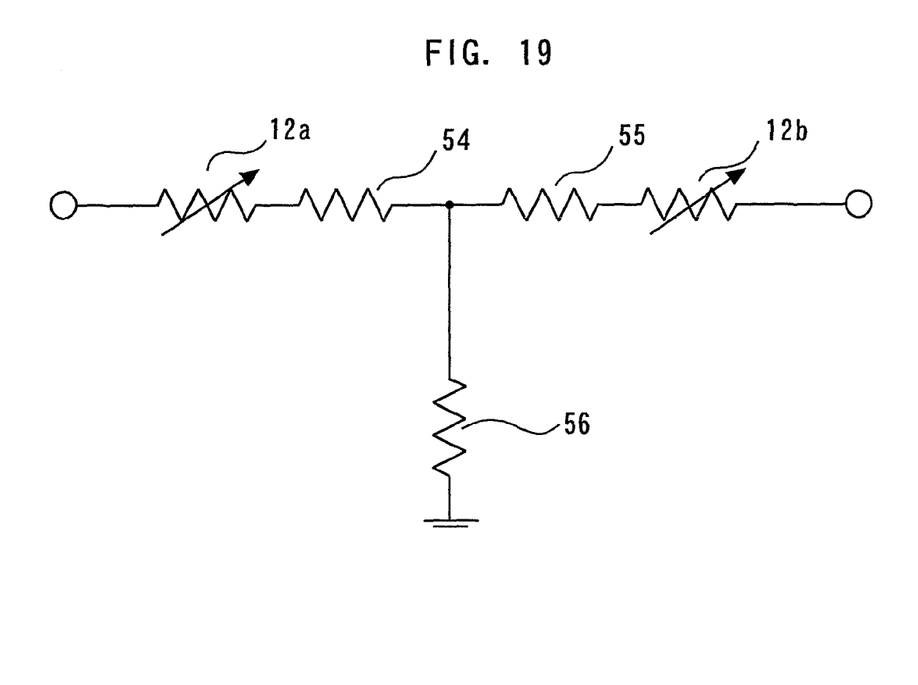
FIG. 19 is a circuit diagram showing a semiconductor device according to the sixth embodiment of the present invention.

FIG. 19 is a circuit diagram showing a semiconductor device according to the sixth embodiment of the present invention. First and second resistors 54 and 55 are connected in series. An end of a third resistor 56 is connected to the connecting point of the first resistor 54 and the second resistor 55, and the other end is grounded in terms of high-frequency waves. Current limiting circuits 12a and 12b are connected to the first resistor 54 and the second resistor 55, respectively. The current limiting circuits 12a and 12b have the same configuration as the current limiting circuits according to the first and second embodiments, and limit current so that no power larger than the allowable maximum power passes through the first to third resistors 54 to 56.

Thereby, since current is limited by the current limiting circuits 12a and 12b even if high-frequency signals of excessive power are supplied to the input-output terminal, the first to third resistors 54 to 56 become difficult to burn. Therefore, a semiconductor device that is highly resistant to destruction even if an excessive electric power is supplied can be obtained.

The resistance values of the first to third resistors 54 to 56 are set so that desired attenuation and input-output impedance are obtained by adding the linear resistance of the current limiting circuits 12a and 12b. Instead of the current limiting circuits 12a and 12b, either one of them can also be used.

Seventh Embodiment

Figure 20:
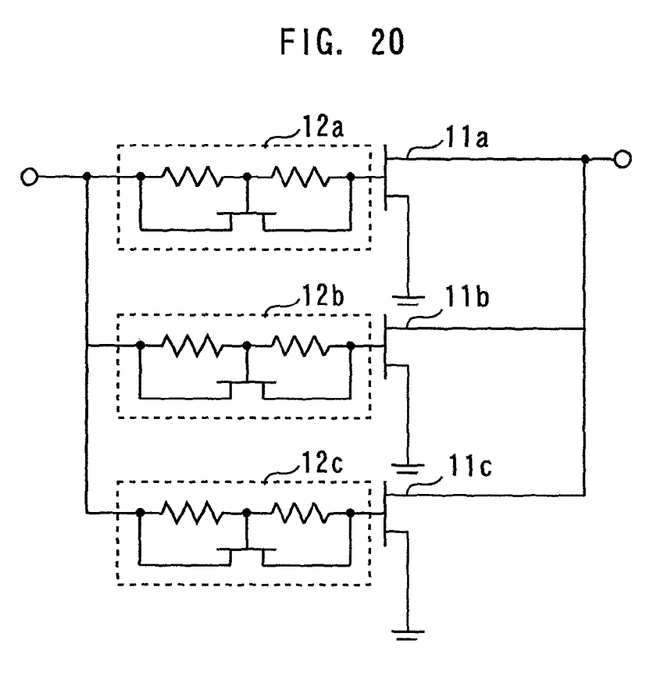
FIG. 20 is a circuit diagram showing a semiconductor device according to the seventh embodiment of the present invention.

FIG. 20 is a circuit diagram showing a semiconductor device according to the seventh embodiment of the present invention. A plurality of amplifying transistors 11a to 11c are connected in parallel. A plurality of current limiting circuits 12a to 12c are connected to the gates (input terminals) of the amplifying transistors 11a to 11c, respectively. Each of the current limiting circuits 12a to 12c has the same configuration of the current limiting circuits according to the first and second embodiments, and limits current so that no power larger than the allowable maximum power passes through the corresponding amplifying transistors 11a to 11c.

Since each amplifying transistor is thus provided with a current limiting circuit, high-frequency current flowing in the gate of each amplifying transistor can be limited without intervention of unnecessary parasitic components of LC compared with the case wherein current flowing through a plurality of amplifying transistors are collectively limited. Therefore, even high-frequency waves, such as millimeter-waves, can limit high-frequency current flowing through the gate of each amplifying transistor. Thereby, the semiconductor device is highly resistant to destruction even if excessive power is supplied, and can be used as a limiter amplifier at high frequencies.

In the seventh embodiment, although each amplifying transistor is equipped with a current limiting circuit, each group of two or more amplifying transistors may be equipped with a current limiting circuit.

Eighth Embodiment

Figure 21:
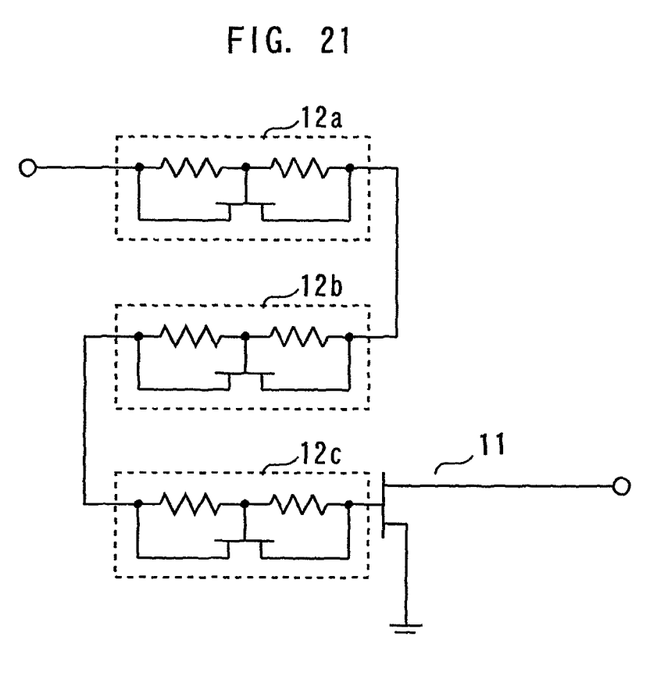
FIG. 21 is a circuit diagram showing a semiconductor device according to the eighth embodiment of the present invention.

FIG. 21 is a circuit diagram showing a semiconductor device according to the eighth embodiment of the present invention. A plurality of current limiting circuits 12a to 12c are connected to the gate (input terminal) of an amplifying transistor in series. The plurality of current limiting circuits 12a to 12c have the same configuration as the current limiting circuits according to the first and second embodiments, and limit current so that no power larger than the allowable maximum power passes through the amplifying transistor 11.

In the eighth embodiment, since three current limiting circuits are connected in series, the semiconductor device can resist to a voltage three times the breakdown voltage of each current limiting circuit. Therefore, a semiconductor device that is highly resistant to destruction even if an excessive electric power is supplied can be obtained.

In the eighth embodiment, although three current limiting circuits are provided, the present invention is not limited thereto, but the provision of two or more current limiting circuits is required.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-137127, filed on May 23, 2007 including specification, claims, drawings and summary, on which the Convention priority of the present application is based, are incorporated herein by reference in its entirety.

What is claimed is:

1. A semiconductor device comprising:
an amplifying transistor having an output terminal; and
a current limiting circuit connected to the output terminal of said amplifying transistor, wherein
said current limiting circuit limits current so that electric power larger than a maximum electric power allowable for said amplifying transistor does not pass, and
said current limiting circuit includes
a protecting transistor having a source, a gate, and a drain.,
a first protecting resistor connecting the source of said protecting transistor to the gate of said protecting transistor, and
a second protecting resistor connecting the drain of said protecting transistor to the gate of said protecting transistor.

2. A semiconductor device comprising:
an amplifying transistor having an output terminal;
a ¼ wavelength line having a first end connected to the output terminal of said amplifying transistor; and
a current limiting circuit having a first terminal connected to a second end of said ¼ wavelength line, and a second terminal which is grounded in terms of high-frequency waves, wherein
said current limiting circuit limits current so that electric power larger than a maximum electric power allowable for said amplifying transistor does not pass, and
said current limiting circuit includes
a protecting transistor having a source, a gate, and a drain,
a first protecting resistor connecting the source of said protecting transistor to the gate of said protecting transistor, and
a second protecting resistor connecting the drain of said protecting transistor to the gate of said protecting transistor.

3. A semiconductor device comprising:
a terminating resistor; and
a current limiting circuit having a first end connected to said terminating resistor and a second end which is grounded in terms of high-frequency waves, wherein
said current limiting circuit limits current so that electric power larger than a maximum electric power allowable for said terminating resistor does not pass, and
said current limiting circuit includes
a protecting transistor having a source, a gate, and a drain,
a first protecting resistor connecting the source of said protecting transistor to the gate of said protecting transistor, and
a second protecting resistor connecting the drain of said protecting transistor to the gate of said protecting transistor.

4. A semiconductor device comprising:
first and second resistors connected in series;
a third resistor having a first end connected to a connecting point of said first resistor and said second resistor, and a second end which is grounded in terms of high-frequency waves; and
a current limiting circuit connected to one of said first resistor and said second resistor, wherein
said current limiting circuit limits current so that an electric power larger than a maximum electric power allowable for said first, second, and third resistors does not pass, and
said current limiting circuit includes
a protecting transistor having a source, a gate, and a drain.,
a first protecting resistor connecting the source of said protecting transistor to the gate of said protecting transistor, and
a second protecting resistor connecting the drain of said protecting transistor to the gate of said protecting transistor.

* * * * *

UNITED STATES PATENT AND TRADEMARK OFFICE
CERTIFICATE OF CORRECTION

| | | |
|---|---|---|
| PATENT NO. | : 7,859,341 B2 | Page 1 of 1 |
| APPLICATION NO. | : 12/715424 | |
| DATED | : December 28, 2010 | |
| INVENTOR(S) | : Inoue et al. | |

It is certified that error appears in the above-identified patent and that said Letters Patent is hereby corrected as shown below:

On the title page item (75) Change "Seiko Goto" to --Seiki Goto--.

Signed and Sealed this
Twenty-sixth Day of April, 2011

David J. Kappos
*Director of the United States Patent and Trademark Office*